United States Patent [19]

Minamikata et al.

[11] Patent Number: 4,855,119
[45] Date of Patent: Aug. 8, 1989

[54] METHOD OF MANUFACTURING SILICON CARBIDE WHISKER

[75] Inventors: Hajime Minamikata; Toshiaki Kanno; Masahiro Kanda; Hitoshi Ushijima, all of Shizuoka, Japan

[73] Assignee: Yazaki Corporation, Japan

[21] Appl. No.: 244,659

[22] Filed: Sep. 15, 1988

Related U.S. Application Data

[63] Continuation of Ser. No. 53,629, May 26, 1987, abandoned.

[30] Foreign Application Priority Data

May 26, 1986 [JP] Japan .............................. 61-119112

[51] Int. Cl.$^4$ ............................................. C01B 31/36
[52] U.S. Cl. ..................................... 423/346; 423/345
[58] Field of Search ............................... 423/345, 346

[56] References Cited

U.S. PATENT DOCUMENTS

| | | | |
|---|---|---|---|
| 4,552,740 | 11/1985 | Morgan et al. | 423/345 |
| 4,640,830 | 2/1987 | Arakawa | 423/346 |

*Primary Examiner*—John Doll
*Assistant Examiner*—Lori S. Freeman
*Attorney, Agent, or Firm*—Wigman & Cohen

[57] ABSTRACT

A method for manufacturing a silicon carbide whisker comprising heating a reaction zone to a temperature in the range of 1,000° C. to 1,200°; supplying a reducing or inactive gas and a sulfur-containing organic siloxane compound; thermally decomposing in vapor phase to react silicon and carbon contained in the sulfur-containing organic siloxane compound by a gaseous phase reaction and recovering a silicon carbide whisker, characterized in that the sulfur promotes the reaction between the silicon and the carbon.

14 Claims, No Drawings

METHOD OF MANUFACTURING SILICON CARBIDE WHISKER

This is a continuation of co-pending application Ser. No. 053,629 filed on May 26, 1987.

BACKGROUND OF THE INVENTION

1. Field of the Invention

The present invention relates to a method of manufacturing a silicon carbide whisker, and more particularly to a method of manufacturing a silicon carbide whisker which is useful as a reinforcing material for various kinds of composite materials.

2. Description of the Prior Art

A silicon carbide whisker is high in strength, has a superior thermal resistance and a resistance to oxidation, and moreover, has low reactivity with metals and has a satisfactory wettability. For these reasons it is used as a raw material for various kinds of composite materials such as fiber reinforced plastics (FRP) and fiber reinforced metals (FRM) through combination with a metal, ceramic, or resin material.

As a method of manufacturing such a silicon carbide fiber, there is known a method by which an organic high molecular silicon compound that has carbon and silicon as its basic structural components, is spun into yarns, sintered, and further given a heating treatment at a high temperature (Japanese Provisional Patent Publication No. 52-70122). However, the method has problems in that its process of manufacture is complicated, control of the temperature for heat treatment is not easy, and a fiber with small diameter is difficult to obtain.

In addition to the above, there are known a method in which silicon is deposited on the surface of a carbon fiber by a vapor phase thermal decomposition method, and then carbon is converted to silicon carbide by sintering it at a high temperature (Japanese Provisional Patent Publication No. 50-38700), and a method in which a mixture of incinerated residue of true grasses and carbon black is treated at a high temperature in a nonoxidizing atmosphere (Japanese Provisional Patent Publication No. 57-209813). However, both methods have problems in that they require a heat treatment at high temperatures, and the purity of the product is low.

Moreover, there is known a method in which a gaseous mixture of a halogen-containing silicon compound and a hydrocarbon is thermally decomposed in a hydrogen atmosphere. However, there were problems in that the method requires a high reaction temperature and also that the whiskers produced are too minute such that the desired physical properties cannot be obtained when they are used for composite materials.

SUMMARY OF THE INVENTION

Accordingly, the principal object of the present invention is to solve the above-mentioned problems and to provide a method of manufacturing a silicon carbide whisker which has a suitable form as a raw material for composite materials such as the FRP and FRM.

Another object of the present invention is to provide a method of manufacturing a silicon carbide whisker with high purity suitable as a raw material for the composite materials.

Still another object of the present invention is to provide a simple and easy method of manufacturing a silicon carbide whisker which is suited as a reinforcing material for the composite materials.

Still another object of the present invention is to provide a high-yielding method of manufacturing a silicon carbide whisker which is suited as a raw material for the composite materials.

A feature of the present invention which is aimed at achieving the above objects resides in that a sulfur-containing organic silicon compound or a mixture of a sulfur-containing organic silicon compound and a hydrocarbon compound is thermally decomposed in vapor phase at a temperature in the range between 1,100° C. and 1,500° C. under the presence of a reducing or inert carrier gas.

These and additional objects, features and advantages of the present invention will become apparent to those skilled in the art from the following detailed description on which, by way of example, only the preferred embodiments of this invention are illustrated.

DETAILED DESCRIPTION OF THE INVENTION

As already mentioned, a silicon carbide whisker of the present invention is used as a raw material for the composite material such as FRP and FRM.

What is meant here by a composite material is a material which has properties that are superior to those of the raw material alone, obtained by mixing or combining a reinforcing material consisting of a fibrous raw material and a matrix consisting of a bonding material for bonding the fibrous raw material. These composite materials possess very high strength, rigidity, and so on so that they are used widely for such items as general structural equipment, ships, boats, construction materials, sports equipment and structural materials for air planes. In particular, composite materials that use carbonaceous fibers have advantages, such as being light-weighted, so that they are utilized in the areas of structural materials for aircrafts, automobiles, and the like, CFRP springs, medical equipment and materials, and so forth.

The silicon carbide fiber in accordance with the present invention is one of the carbonaceous fibers mentioned in the above. Since it reacts only weakly with metals and has a superior wettability and a stability at high temperatures, it enables the manufacture of FRM relatively easily even without being given a surface treatment. Accordingly, its usefulness as a raw material for composite materials is highly appreciated and it has been expected to lead to an easy and a highly efficient method of manufacturing composite materials.

The present method of manufacturing which will meet such an expectation is a method in which a sulfur-containing organic silicon compound or a mixture of a sulfur-containing organic compound and a hydrocarbon compound, is decomposed in the vapor phase at a high temperature in the range of 1,100° C. to 1,500° C., under the presence of a reducing or inactive carrier gas.

A sulfur-containing organic silicon compound which is to be used as a raw material for a silicon carbide whisker of the present invention is a silane or siloxane that contains the carbon-silicon bonding; at least a part of organic group included therein consists of a sulfur-containing group that includes, for instance, the mercapto structure or the thioether structure. A part of the organic group included in the silicon or siloxane may contain oxygen or nitrogen, or may be an alkoxy group and the like. Further, such a silane or siloxane must permit gasification, and may be a chain-like substance or a polymer as long as it is gasifiable.

Examples of such sulfur-containing organic silicon compound are as follows:

(1) silane such as tetraethyl-silane, trimethyl silane and hexamethyl disilane, which is generally represented by a formula,

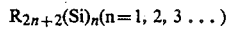

$R_{2n+2}(Si)_n (n=1, 2, 3 \ldots)$ wherein R is hydrogen atom, methyl radical, ethyl radical, phenyl radical or the like;

(2) mercapto-modified silane such as γ-mercaptopropyl trimathoxy silane, which is generally represented by a formula,

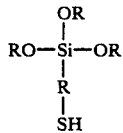

wherein R is methyl radical, ethyl radical, propyl radical, phenyl radical or the like;

(3) organopolysiloxane such as dimethyl polysilosame and methylphenyl polysiloxane, which is generally represented by a formula,

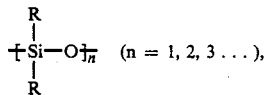

$+Si-O+_n \quad (n = 1, 2, 3 \ldots),$ wherein R is methyl radical, phenyl radical, alkyl radical with long chair or the like;

(4) mercapto-modified organopolysiloxane such as mercapto-modified dimethyl polysiloxane, which is generally represented by a formula

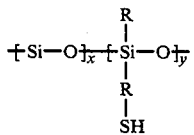

wherein R is methyl radical, ethyl radical, propyl radical, phenol radical or the like.

Hydrocarbon compounds that are to be used in the present invention along with organic silicon compounds, may be aliphatic compound, aromatic compound, or any other kind of hydrocarbon compound; and compounds that contain sulfur may also be used suitably. Further, they may also contain elements like oxygen, but such a compound should not be used in excess since a compound with high content of oxygen will lower the reaction yield. As such hydrocarbon compounds, one may mention methane, ethane, propane, or thiophene and toluenthiol. These may be used individually or in combination of a plurality of them, although they need not be limited to these examples alone.

Raw materials for a silicon carbide whisker consists of 30 to 100% by volume, preferably 50 to 100% by volume of an organic silicon compound, and 0 to 70% by volume, preferably 0 to 50% by volume of a hydrocarbon compound. These raw materials are gasified and are sent to a reactor along with a carrier gas.

As a reducing or inactive gas to be employed in the present invention, use may be made of hydrogen or argon gas. Hydrogen gas is particularly suited, but a mixed gas of hydrogen and argon will also do well. Moreover, hydrogen sulfide may be mixed in the carrier gas. When the sulfur content of an organic silicon compound is low, and moreover, the sulfur content of a hydrocarbon compound is low, whisker growth will be favored by the mixing of hydrogen sulfide in the carrier gas.

Thermal decomposition reaction for the present invention is carried out at a temperature in the range of 1,100° C. to 1,500° C., preferably 1,200° C. to 1,400° C. As an apparatus for this purpose, use may be made, for example, of an apparatus in which a heat-resistant reaction tube made of alumina or the like is provided within a horizontal electric furnace. In addition, it is preferred to install a heat-resistant substrate made of alumina or graphite within the reaction tube, in consideration of the ease in taking out the product.

In the present invention, the interaction mechanism of a small amount of sulfur that is present in the reaction system is not known clearly. Generally speaking, however, it is considered that in the process of producing silicon carbide (SiC) from silicon (Si) and carbon (C), there are produced SiS, $SiS_2$, and so on as intermediate products of the reaction by which the activation energy is lowered, causing a favorable proceeding of the reaction.

As described in the foregoing, according to the present method of manufacturing a silicon carbide whisker, it is possible to easily obtain a whisker with a form that is suited for use as a filled reinforcing material for various kinds of composite materials.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

EXAMPLE 1

Inside a horizontal electric furnace there is installed an alumina-made reaction tube with inner diameter of 52 mm, and an alumina-made substrate is fixed to the reaction zone portion at the center of the furnace.

As a sulfur-containing organic silicon compound to be utilized as a reaction material, use was made of mercapto-modified silicon oil (A) which contains dimethylsiloxane unit and mercaptopropylmethylsiloxane unit in the ratio of 140 to 3 within one molecule. In addition, benzene (B) was used as a hydrocarbon compound. Then, reaction materials were prepared by using mercapto-modified silicon oil (A) alone or by mixing mercapto-modified silicon oil (A) and benzene (B).

The reaction materials were supplied at the rate of 5 cc/hour to a zone with a temperature of about 300° C. which is in front of the reaction zone, while heating the reaction zone to 1,300° C. and passing through hydrogen as the carrier gas at the rate of 120 cc/min. After allowing the reaction to proceed for 2 hours, supply of the reaction materials was discontinued, and the product was taken out after cooling.

The composition of the reaction materials, the amount of hydrogen sulfide in the carrier gas, and the kinds and the amounts of the products are summarized in Table 1. In the table, the white silicon carbide whisker obtained in the products is designated by S and the carbon whisker is designated by C. Further, "yield" in the table represents the weight of the products obtained from 100 g of the reaction materials.

TABLE 1

| Embodiment | Reaction Materials A/B | Hydrogen Sulfide cc/min | Products | Yield g | Diameter μm | Maximum Length cm |
|---|---|---|---|---|---|---|
| 1 | 10/0 | 0 | S | 1 | 0.5 | about 3 |
| 2 | 10/0 | 1 | S | 1 | 0.5 | 3 |
| 3 | 7/3 | 0 | S | 1 | 0.5 | 3 |
| 4 | 7/3 | 1 | S | 0.8 | 0.5 | 1 |
| 5 | 5/5 | 0 | S | 0.7 | 0.5 | 2 |
| 6 | 5/5 | 1 | S + C | — | — | — |

As seen from Table 1, according to Embodiments 1 to 5, there were obtained silicon carbide whiskers with very small fiber diameter of about 0.5 μm. In contrast, the method described in Japanese Provisional Patent Publication No. 52-70122, for example, can produce only silicon carbide whiskers with fiber diameter of about 40 to 60 μm.

Moreover, in contrast to Embodiments 1 to 5 which can produce white whiskers with little mixing of impurities, prior art such as those in Japanese Provisional Patent Publication No. 50-38700 and Japanese Provisional Patent Publication No. 57-209813 can produce only low purity silicon carbide whiskers of such silicon carbide that shows the "diffraction lines of graphite and silicon" or silicon carbide of "light greenish white color."

Furthermore, the present embodiments permit to obtain silicon carbide whiskers by the heating of the reaction materials for only once in the electric furnace, so that the manufacturing process can be made simpler and easier compared with the manufacturing method like that of Japanese Provisional Patent Publication No. 52-70122 which requires a repetition of sintering any heating.

Still further, the present embodiments require only a heating of the reaction zone at a fixed temperature of about 1,300° C. This leads to a heating equipment which is simpler in comparison to that of the method in Japanese Provisional Patent Publication No. 50-38700 which requires a heating at a high temperature of about 2,200° C., that of the method in Japanese Provisional Patent Publication No. 57-209813 which requires a heating at a high temperature of about 1,600° C., or that of the method in Japanese Provisional Patent Publication No. 52-70122 which requires various temperature controls for a plurality of manufacturing processes.

EXAMPLE 2

Using the same apparatus as in Example 1, a reaction which is analogous to that of Example 1 was given for 2 hours, except for the exclusive use, as a reaction material, of a mercapto-modified silicon oil whose mercapto group content was one tenth of that of the mercapto-modified silicon oil (A) used in Example 1, and for the nonsupply of hydrogen sulfide. As a result, there was obtained 0.1 g (yield) of white silicon carbide whisker of mean diameter 0.5 μm and maximum length 5 mm.

EXAMPLE 3

As a result of a reaction, for 2 hours, analogous to that of Example 2, by the use of the same apparatus as in Example 1, except for a supply of γ-mercaptopropyltrimethoxysilane as a reaction material to a zone of temperature of about 100° C. which is in front of the reaction zone at the rate of 2.5 cc/hour, there was obtained 0.8 g (yield) of white silicon carbide whisker with mean diameter 0.5 μm and maximum length 2 cm.

What is claimed is:

1. A method of manufacturing a silicon carbide whisker, comprising the steps of:
   (a) heating a reaction zone to a temperature in the range of 1,100° C. to 1,500° C.:
   (b) supplying a carrier gas and reaction materials to said reaction zone, said carrier gas consisting of a reducing or inactive gas, and said reaction materials consisting of a sulfur-containing organic siloxane compound wherein said sulfur promotes the reaction between silicon and carbon;
   (c) thermally decomposing, in vapor phase, said reaction materials to react silicon and carbon contained in said reaction materials by a gaseous phase reaction; and
   (d) recovering a silicon carbide whisker.

2. The method of manufacturing silicon carbide whisker of claim 1, wherein said carrier gas is hydrogen.

3. The method of manufacturing silicon carbide whisker of claim 1, wherein said carrier gas further contains hydrogen sulfide.

4. The method of manufacturing silicon carbide whisker of claim 1, wherein said sulfur-containing organic siloxane compound is a mercapto-modified silicon oil which contains dimethylsiloxane unit and mercaptopropylmethylsiloxane unit in the ratio of about 140 to 3 in one molecule.

5. The method of manufacturing silicon carbide whisker of claim 4, wherein said reaction materials further contains benzene.

6. The method of manufacturing silicon carbide whisker of claim 1, wherein said sulfur-containing organic siloxane compound is γ-mercaptopropyltrimethoxysilane.

7. A method according to claim 1, wherein said reaction material is supplied to the reaction zone at the rate of about 1 cubic centimeters per hour or more.

8. The method according to claim 1, wherein said siloxane compound is a polysiloxane taken from the group consisting of dimethyl polysiloxane and methyl phenyl polysiloxane.

9. The method according to claim 1 wherein said siloxane is a mercapto-modified silicon oil.

10. The method according to claim 9 wherein said mercapto-modified silicon oil comprises δ-mercaptopropyltrimethoxysilane.

11. The method according to claim 8 further including the step of adding a hydrocarbon compound selected from the group consisting of aliphatic, aromatic and sulfur-containing compounds.

12. The method according to claim 8 including the step of adding a gaseous hydrocarbon taken from the group consisting of methane and ethane.

13. The method according to claim 9 including the step of adding a gaseous hydrocarbon taken from the group consisting of methane and ethane.

14. The method according to claim 10 including the step of adding a gaseous hydrocarbon taken from the group consisting of methane and ethane.

* * * * *

UNITED STATES PATENT AND TRADEMARK OFFICE
CERTIFICATE OF CORRECTION

PATENT NO. : 4,855,119
DATED : August 8, 1989
INVENTOR(S) : Hajime MINAMIKATA et al It is certified that error appears in the above-identified patent and that said Letters Patent is hereby corrected as shown below:

IN THE SPECIFICATION:

Column 3, line 14, "trimathoxy" should be --trimethoxy--;
lines 26 and 27, "polysilosame" should be --polysiloxane--.

IN THE CLAIMS:

Claim 10, column 6, lines 56 and 57,
"$\delta$-mercaptopropyltrimethoxysilane" should be
--$\gamma$-mercaptopropyltrimethoxysilane--.

Signed and Sealed this

Twenty-first Day of August, 1990

Attest:

HARRY F. MANBECK, JR.

Attesting Officer

Commissioner of Patents and Trademarks